US009379096B2

(12) United States Patent
Denta et al.

(10) Patent No.: US 9,379,096 B2
(45) Date of Patent: Jun. 28, 2016

(54) SEMICONDUCTOR DEVICE

(71) Applicant: FUJI ELECTRIC CO., LTD., Kawasaki-shi (JP)

(72) Inventors: Toshio Denta, Matsumoto (JP); Tomonori Seki, Azumino (JP); Tadanori Yamada, Matsumoto (JP); Tadahiko Sato, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/483,742

(22) Filed: Sep. 11, 2014

(65) Prior Publication Data

US 2014/0374889 A1 Dec. 25, 2014

Related U.S. Application Data

(63) Continuation of application No. PCT/JP2013/061283, filed on Apr. 16, 2013.

(30) Foreign Application Priority Data

Jun. 13, 2012 (JP) .................................. 2012-133982

(51) Int. Cl.
*H01L 25/18* (2006.01)
*H01L 23/498* (2006.01)
(Continued)

(52) U.S. Cl.
CPC ............... *H01L 25/18* (2013.01); *H01L 23/24* (2013.01); *H01L 23/3735* (2013.01); *H01L 23/495* (2013.01); *H01L 23/49517* (2013.01); *H01L 23/49575* (2013.01); *H01L 23/49811* (2013.01); *H01L 23/49833* (2013.01); *H01L 24/49* (2013.01); *H01L 25/162* (2013.01);
(Continued)

(58) Field of Classification Search
None
See application file for complete search history.

(56) References Cited

U.S. PATENT DOCUMENTS 6,144,571 A * 11/2000 Sasaki ................... H01L 25/162
257/687
6,291,880 B1 * 9/2001 Ogawa ................ H01L 23/4334
257/723

(Continued)

FOREIGN PATENT DOCUMENTS

| JP | H05-304248 A | 11/1993 |
| JP | 3021070 U | 2/1996 |
| JP | 2002-203940 A | 7/2002 |

OTHER PUBLICATIONS

PCT, "International Search Report for International Application No. PCT/JP2013/061283".

*Primary Examiner* — William Coleman
*Assistant Examiner* — Kien Ly
(74) *Attorney, Agent, or Firm* — Manabu Kanesaka

(57) ABSTRACT

A semiconductor device includes a plurality of semiconductor elements; first semiconductor chips including first semiconductor elements, the first semiconductor elements being defined as semiconductor elements in the plurality of semiconductor elements and having a current flowing greater than that of the other semiconductor elements; second semiconductor chips having second semiconductor elements, the second semiconductor elements being defined as semiconductor elements in the plurality of semiconductor elements for controlling the first semiconductor elements; an insulating substrate having a first wiring pattern bonded with the first semiconductor chips; and an insulating member having a second wiring pattern mounted with the second semiconductor chips.

9 Claims, 4 Drawing Sheets

(51) Int. Cl.
    *H01L 23/373*     (2006.01)
    *H01L 23/495*     (2006.01)
    *H01L 23/00*     (2006.01)
    *H01L 25/16*     (2006.01)
    *H01L 23/50*     (2006.01)
    *H01L 23/24*     (2006.01)

(52) U.S. Cl.
    CPC ........... *H01L23/49861* (2013.01); *H01L 23/50* (2013.01); *H01L 2224/48091* (2013.01); *H01L 2224/48101* (2013.01); *H01L 2224/48105* (2013.01); *H01L 2224/48137* (2013.01); *H01L 2224/48139* (2013.01); *H01L 2224/48247* (2013.01); *H01L 2224/48472* (2013.01); *H01L 2224/49107* (2013.01); *H01L 2924/00014* (2013.01); *H01L 2924/1203* (2013.01); *H01L 2924/1305* (2013.01); *H01L 2924/13055* (2013.01)

(56) References Cited

U.S. PATENT DOCUMENTS

| | | | | |
|---|---|---|---|---|
| 6,313,598 | B1* | 11/2001 | Tamba et al. ................. 318/722 |
| 6,642,576 | B1* | 11/2003 | Shirasawa et al. ............ 257/328 |
| 2007/0257343 | A1* | 11/2007 | Hauenstein et al. .......... 257/676 |
| 2009/0243078 | A1* | 10/2009 | Lim .................... H01L 23/4334 257/690 |

* cited by examiner

SEMICONDUCTOR DEVICE

RELATED APPLICATIONS

The present application is a continuation application of PCT International Application No. PCT/JP2013/061283 filed Apr. 16, 2013, and claims priority from Japanese Application No. 2012-133982 filed Jun. 13, 2012.

TECHNICAL FIELD

The present invention relates to a semiconductor device.

BACKGROUND ART

A module type power semiconductor device is a device integrating a main circuit, including such semiconductor chips as power transistors and diodes used for switching and other power controls, and a control circuit, including control semiconductor chips for controlling operation of the main circuit. This module type power semiconductor device is primarily used for inverters which control motors or the like.

FIG. 4 is a cross-sectional view depicting a cross-sectional structure of a conventional module type power semiconductor device. As illustrated in FIG. 4, the conventional module type power semiconductor device has a structure where a main circuit 100a and a control circuit 100b for controlling the main circuit 100a, are mounted on a same main circuit substrate 101. The main circuit substrate 101 is an insulating substrate where an insulating layer 103 is disposed on the surface of a metal plate 102, which has good thermal conductivity. A main circuit wiring pattern 104 is formed on the insulating layer 103 of the main circuit substrate 101.

Semiconductor elements constituting the main circuit 100a are formed on semiconductor chips 105 and 106. The rear surfaces of the semiconductor chips 105 and 106 are bonded with the main circuit wiring pattern 104 of the main circuit substrate 101 by a bonding material (not illustrated), such as solder. An IGBT (Insulated Gate Bipolar Transistor) and an FWD (Free Wheeling Diode) are formed respectively on the semiconductor chips 105 and 106.

A control circuit substrate 107 is an insulating substrate where a control circuit wiring pattern 108 is formed on the front surface. The control circuit substrate 107 has a via hole structure. The control circuit wiring pattern 108 and a metal film formed on the rear surface of the control circuit substrate 107 are connected by the via holes. The rear surface of the control circuit substrate 107 is bonded, by insulating adhesive 110, with the insulating layer 103 of the main circuit substrate 101 in an area where the main circuit wiring pattern 104 is not disposed.

A control semiconductor element constituting the control circuit 100b is formed on a control semiconductor chip 109. The rear surface of the control semiconductor chip 109 is bonded with the control circuit wiring pattern 108 of the control circuit substrate 107 through a bonding material (not illustrated), such as a solder. Electrodes disposed on the front surfaces of the semiconductor chips 105 and 106 (not illustrated, hereafter called "front surface electrodes") are electrically connected with the main circuit wiring pattern 104 and the control circuit wiring pattern 108 by bonding wires 111.

A case 112 is bonded with the rim of the main circuit substrate 101. A plurality of lead terminals (lead frame) 113a and 113b used for external connection is disposed inside the case 112. One end of the lead terminal 113 used for power is exposed outside the case 112, and the other end is connected to an output electrode of the main circuit 100a by solder or the like. One end of the lead terminals 113b used for control is exposed outside the case 112, and the other end is connected to an input electrode of the control circuit 100b by a solder or the like. Sealing resin 114 fills the space between the case 112 and the main circuit substrate 101.

In such a module type power semiconductor device, the heat loss generated in the main circuit 100a must be effectively radiated to the outside of the device. In the case of the module type power semiconductor device illustrated in FIG. 4, the heat loss generated in the semiconductor chips 105 and 106 and the main circuit wiring pattern 104, which are areas where a large amount of current flows, is conducted to the metal plate 102 via the insulating layer 103. The heat loss conducted to the metal plate 102 is conducted to an external heat radiation mechanism bonded with the metal plate 102, and heat is radiated.

The semiconductor chip 109, on the other hand, is a control IC (Integrated Circuit) for generating control signals which are inputted to the semiconductor elements on the semiconductor chips 105 and 106, where only weak current flows. Therefore the control circuit substrate 107, on which the control semiconductor chip 109 is mounted, does not require a special configuration to radiate heat. As a consequence, the control circuit substrate 107 is disposed on the insulating layer 103 of the main circuit substrate 101, so as to prevent the propagation of noise generated during switching of the power semiconductor elements on the semiconductor chips 105 and 106 to the control semiconductor element on the control semiconductor chip 109. The noise prevention effect is greater as the thickness of the control circuit substrate 107 increases.

The following device has been proposed as a module type power semiconductor device (e.g. see Patent Document 1). In the module type power semiconductor device, a metal insulating substrate, semiconductor chips mounted on the metal insulating substrate, a control circuit component and external lead-out terminals are housed inside a resin case. The semiconductor chips, the control circuit component and the external lead-out terminals are internally connected by wire bonding. A partition wall that covers the upper surface of the metal insulating substrate, excluding the area where the semiconductor chips are mounted, is formed in the middle stage position in the case, and the external lead-out terminals, the control circuit component, and the wiring conductors thereof are disposed on the upper surface side of the partition plate.

Patent Document 1: Japanese Patent Application Laid-Open No. H5-304248

DISCLOSURE OF THE INVENTION

In the case of the conventional module type power semiconductor device, however, the control circuit substrate 107 is disposed on the main circuit substrate 101, hence as the thickness of the control circuit substrate 107 increases, the step between the principal surfaces of the main circuit substrate 101 and the control circuit substrate 107 increases. Therefore, it is difficult to perform solder printing for mounting the semiconductor chips 105 and 106 and the control semiconductor chip 109 on the main circuit substrate 101 on which the control circuit substrate 107 is disposed. This means that it is difficult to mount the semiconductor chips 105 and 106 and the control semiconductor chip 109 at the same time.

Further, in the case of a conventional module type power semiconductor device, the case 112 and the lead terminals 113a and 113b are separate components, which means that the lead terminals 113a and 113b must be soldered after the main circuit substrate 101 and the control circuit substrate 107 are mounted in the case 112. Moreover, each row of the lead terminals 113a and 113b must be bent twice at different predetermined pitches, so as to match the concave/convex portions of the inner walls of the case 112, and bending accuracy is demanded. Thus the semiconductor chips 105 and 106, the control semiconductor chip 109 and the lead terminals 113a and 113b are mounted in separate steps respectively, which increases the manufacturing steps and increases cost accordingly.

To solve the problems of the prior art, an object of the present invention is to provide a semiconductor device that excels in noise suppression. Furthermore, to solve the problems of the prior art, another object of the present invention is to provide a semiconductor device having a structure that can be manufactured with few manufacturing steps and at low cost.

To solve the problems and achieve the objects of the present invention, a semiconductor device according to this invention has the following features. The semiconductor device includes a plurality of semiconductor elements, and first semiconductor chips having first semiconductor elements, the first semiconductor elements being defined as semiconductor elements in the plurality of semiconductor elements having a current flowing greater than those of the other semiconductor elements. The semiconductor device also includes second semiconductor chips having second semiconductor elements, the second semiconductor elements being defined as semiconductor elements in the plurality of semiconductor elements for controlling the first semiconductor elements. Further, an insulating substrate having a first wiring pattern bonded with the first semiconductor chip and an insulating member having a second wiring pattern mounted with the second semiconductor chip are included.

In the semiconductor device according to the invention described above, a surface of the insulating member formed with the second wiring pattern is located at a higher position than a principal surface of the insulating substrate formed with the first wiring pattern, in a direction perpendicular to the principal surface of the insulating substrate. A step is formed from the principal surface of the insulating substrate formed with the first wiring pattern, and the second wiring pattern and the first wiring pattern are separated by the step, in the direction perpendicular to the principal surface of the insulating substrate.

In the semiconductor device according to the invention described above, the second wiring pattern is integrated with the external connection lead terminals of the second semiconductor elements.

In the semiconductor device according to the invention described above, the second wiring pattern is formed by a metal foil or a lead frame.

In the semiconductor device according to the invention described above, the insulating member is a case integrally molded with the external connection lead terminals of the second semiconductor elements.

In the semiconductor device according to the invention described above, the insulating member is a case integrally molded with the insulating substrate and the second wiring pattern.

In the semiconductor device according to the invention described above, the second wiring pattern is formed on an inner wall of the case.

In the semiconductor device according to the invention described above, at least one of the plurality of second semiconductor elements is mounted on the second wiring pattern in a state in which a rear surface thereof is electrically conductive.

In the semiconductor device according to the invention described above, at least one of the plurality of second semiconductor elements is mounted on the insulating member outside the second wiring pattern.

In the semiconductor device according to the invention described above, at least one of the plurality of second semiconductor elements is mounted on the second wiring pattern in a state in which a rear surface thereof is electrically insulated.

According to the above mentioned invention, the main circuit is constructed by forming the first wiring pattern bonded with the first semiconductor chips, on the insulating substrate, and the control circuit is constructed by forming the second wiring pattern mounted with the second semiconductor chips, on the insulating member other than the insulating substrate. Thereby the main circuit and the control circuit can be separated, and as a result the propagation of noise, generated in the first semiconductor elements (power semiconductor elements) to the second semiconductor elements, can be suppressed.

According to the above mentioned invention, the insulating member and the insulating substrate are disposed so that a step is formed between the surface of the insulating member formed with the second wiring pattern, and the principal surface of the insulating substrate formed with the first wiring pattern. Thereby the second semiconductor chips on the control circuit substrate are disposed distant from the first semiconductor chips on the main circuit substrate in a direction perpendicular to the principal surface of the main circuit substrate, and as a result the propagation of noise, which is generated in the first semiconductor elements, to the second semiconductor elements can be further suppressed.

According to the above mentioned invention, the second wiring pattern is formed by a metal foil or lead frame, hence it is unnecessary to dispose the control circuit substrate as the second wiring pattern, and solder printing for the second wiring pattern is likewise unnecessary. In other words, the first semiconductor chips and the second semiconductor chips can be more easily mounted compared with the case of disposing the first wiring pattern and the second wiring pattern on the main circuit substrate, on which the control circuit substrate is disposed, and performing solder printing for the first wiring pattern and the second wiring pattern.

According to the above mentioned invention, the second wiring pattern is one member that is integrated with the external connection lead terminals, and the lead terminals are formed as one member that is integrally molded with the case, therefore assembly man-hours can be decreased. Thereby a module type semiconductor device which excels in productivity can be manufactured. As a consequence, a semiconductor device having a structure which can be manufactured with few processing steps at low cost can be provided.

According to the above mentioned invention, external connection terminals are constructed by lead terminals, which are integrally molded so as to extend from the case, whereby it is unnecessary to bend the lead terminals at different predetermined pitches depending on the lead terminal row, so as to match with the concave/convex portions of the inner walls of the case. Therefore a number of times of bending the lead terminals can be decreased, and the bending accuracy of the lead terminals can be improved. Furthermore, handling of the lead terminals during assembly becomes easy. As a consequence, a semiconductor device having a structure which can be manufactured with few processing steps at low cost can be provided.

According to the above mentioned invention, the rear surfaces of the second semiconductor chips are bonded with the insulating member other than the insulating substrate, so as to maintain an electrically conducted state or an insulated state with the second wiring pattern. Thereby the plurality of second semiconductor chips formed with different second semiconductor elements can be flexibly mounted inside the case. This means that various second semiconductor chips can be mounted on the same insulating member with few assembly man-hours without changing the case, and the versatility of the case can be increased. As a consequence, the cost of the semiconductor device can be reduced.

According to the semiconductor device of this invention, the noise suppression can be improved. Further, according to the semiconductor device of this invention, a structure that can be manufactured with few processing steps at low cost can be provided.

BEST MODE FOR CARRYING OUT THE INVENTION

Figure 1:
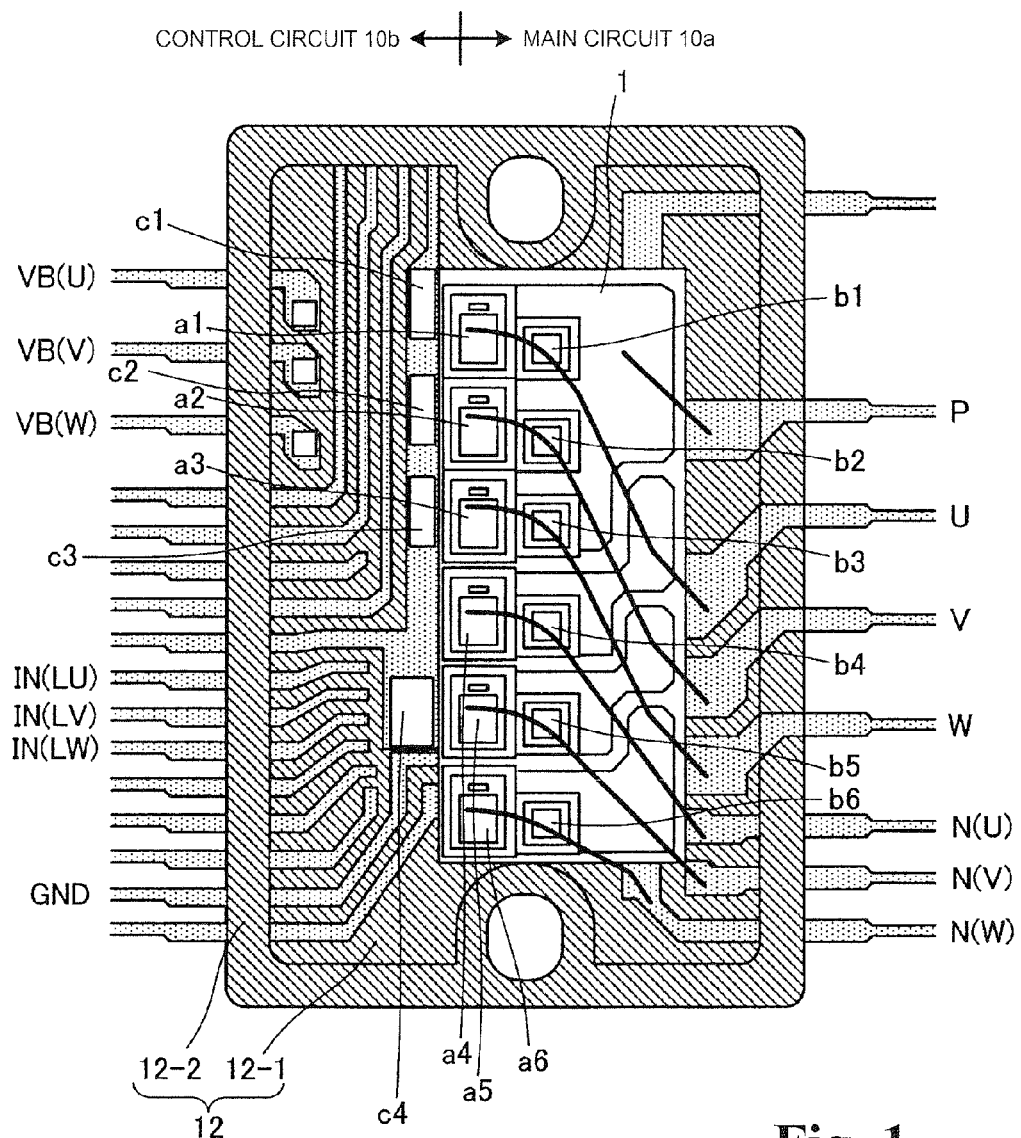
FIG. 1 is a plan view illustrating a planar structure of a module type power semiconductor device according to an embodiment.

An embodiment of the semiconductor device according to the present invention will be described with reference to the accompanying drawings. In the description of the embodiment and the accompanying drawings, a same composing element is denoted with a same reference numeral, where redundant description is omitted.

Embodiment

Figure 2:
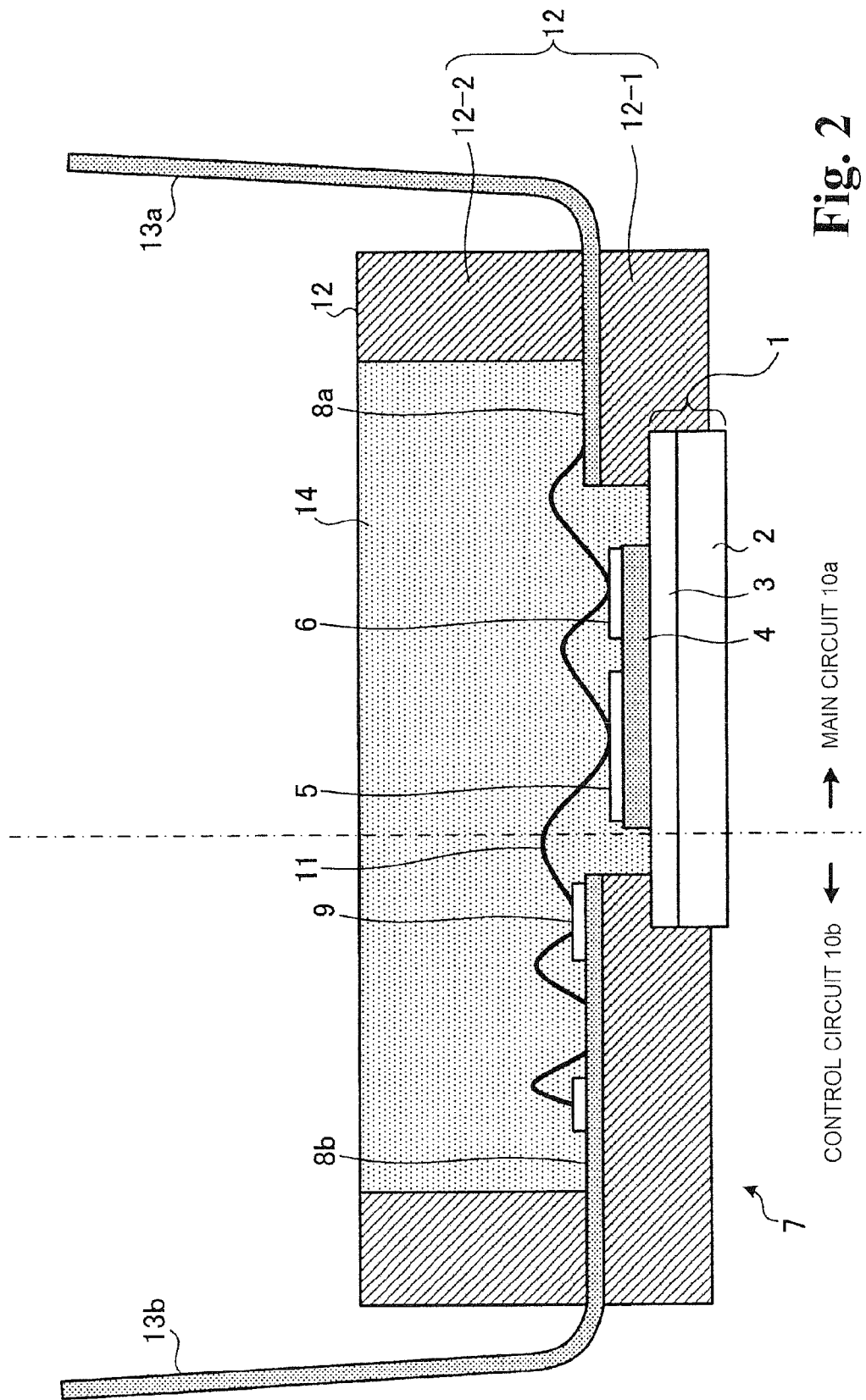
FIG. 2 is a schematic cross-sectional view illustrating a cross-sectional structure of the module type power semiconductor device in FIG. 1.

FIG. 1 is a plan view illustrating a planar structure of a module type power semiconductor device according to an embodiment. FIG. 2 is a schematic cross-sectional view illustrating a cross-sectional structure of the module type power semiconductor device in FIG. 1. As illustrated in FIG. 1 and FIG. 2, the module type power semiconductor device according to this embodiment includes, for example, a main circuit 10a that controls power for switching or the like, and a control circuit 10b that controls the main circuit 10a, in a same module (inside a case 12). The reference numerals 12-1 and 12-2 are a bottom surface portion and a side wall portion constituting the case 12.

The main circuit 10a is constituted by semiconductor chips (first semiconductor chips) a1 to a6 and b1 to b6. The rear surfaces of the semiconductor chips a1 to a6 and b1 to b6 are bonded with a main circuit wiring pattern (first wiring pattern) 4 of a main circuit substrate 1. An IGBT (first semiconductor element) is formed on each of the semiconductor chips a1 to a6 (hereafter called "IGBT chip"). An FWD (first semiconductor element) is formed on each of the semiconductor chips b1 to b6 (hereafter called "FWD chip"). The FWDs on FWD chips b1 to b6 are connected to the IGBTs of the IGBT chips a1 to a6 in parallel and in reverse directions respectively.

A general three-phase inverter circuit is constituted by the IGBT chips a1 to a6 and the FWD chips b1 to b6. In each of the U, V and W phases of the inverter circuit, an upper arm portion (arm portion on the high side) is constituted by the IGBT chips a1 to a3 and the FWD chips b1 to b3. A lower arm portion (arm portion on the low side) is constituted by the IGBT chips a4 to a6 and the FWD chips b4 to b6.

The main current input terminals P, N(U), N(V) and N(W) and the main current output terminals U, V and W are connected to the IGBT chips a1 to a6 and the FWD chips b1 to b6 in a desired configuration through bonding wires having a wide diameter respectively. A detailed connection configuration of each terminal will be described later. The main current input terminals P, N(U), N(V) and N(W) and the main current output terminals U, V and W may be disposed in parallel on one side wall portion 12-2 constituting one side of the rectangular case 12, for example.

The control circuit 10b, on the other hand, is constituted by control semiconductor chips (hereafter called "control IC chips" (second semiconductor chips)) c1 to c4. The rear surfaces of the control IC chips c1 to c4 are bonded with a control circuit wiring pattern (second wiring pattern) 8b formed on the case 12. A control semiconductor element (second semiconductor element) for controlling each IGBT chip a1 to a6 is formed on each of the control IC chips c1 to c4. The control IC chips c1 to c3 are connected to the gates (not illustrated) of the IGBT chips a1 to a3 on the high side respectively, and generate control signals which are inputted to the IGBT chips a1 to a3 respectively. The control IC chip c4 is connected to the gates (not illustrated) of the IGBT chips a4 to a6 on the low side, and generates control signals which are inputted to the IGBT chips a4 to a6.

The control signal input terminals VB(U), VB(V), VB(W), IN(LU), IN(LV) and IN(LW) are connected to the control IC chips c1 to c4 in a desired configuration through bonding wires having a narrow diameter respectively. A detailed connection configuration of each terminal will be described later. The control signal input terminals VB(U), VB(V), VB(W), IN(LU), IN(LV) and IN(LW) may be disposed in parallel on the other side wall portion 12-2 of the case 12, for example. GND is a ground terminal.

The cross-sectional configuration of the module type power semiconductor device according to this embodiment will now be described in detail. FIG. 2 is a cross-sectional structure of the IGBT chip and the FWD chip constituting one arm portion of the module type power semiconductor device illustrated in FIG. 1, and the control IC chip for controlling the arm portion. The case 12 has the bottom surface portion 12-1, which is parallel with a principal surface (surface on which the main circuit wiring pattern 4 of the main circuit substrate 1 is formed) of the main circuit substrate 1, and the side wall portion 12-2, which is perpendicular to the principal surface of the main circuit substrate 1. The bottom surface portion 12-1 and the side wall portion 12-2 are connected to each other at one end, forming an approximately L-shaped cross section.

The other end of the bottom surface portion 12-1 of the case 12 is bonded with the rim of the main circuit substrate 1. The conductor patterns 8a and 8b are formed on the bottom surface portion 12-1 of the case 12 by a metal foil or a lead frame, for example. A plurality of lead terminals (lead frame) 13a, 13b, which is integrally inserted and molded with the case 12, so as to extend from the case 12 is arranged.

Ends, on one side, of the lead terminals 13a and 13b are exposed outside the case 12 and constitute the external connection terminal. The other ends of the lead terminals 13a and 13b are exposed inside the case 12, and are connected to the conductor patterns 8a and 8b respectively. Out of the conductor patterns 8a and 8b, the conductor pattern 8b, which is connected to the lead terminal used for control 13b, is assumed to be a control circuit wiring pattern of the control circuit 10b (hereafter called "control circuit wiring pattern 8b"). If the control circuit wiring pattern 8b is formed by the lead frame, the control circuit wiring pattern 8b may be integrated with the lead terminals used for control 13b.

The main circuit substrate 1 is an insulating substrate where an insulating layer 3 is disposed on the surface of a metal plate 2 which has good thermal conductivity. The main circuit wiring pattern 4 is formed on the insulating layer 3 of the main circuit substrate 1. The rear surfaces of the semiconductor chips 5 and 6 are bonded with the main circuit wiring pattern 4 of the main circuit substrate 1 by a bonding material (not illustrated), such as a solder. The semiconductor chips 5 and 6 constitute the main circuit 10a. The semiconductor chips 5 correspond to the IGBT chips a1 to a6 in FIG. 1, and the semiconductor chips 6 correspond to the FWD chips b1 to b6 in FIG. 1.

The front surface electrodes (not illustrated) of the semiconductor chips 5 and 6 are electrically connected to the conductor pattern 8a through the bonding wires 11 having a wide diameter. The lead terminals used for power 13a correspond to the main curent input terminals P, N(U), N(V) and N(W) of the IGBT chips a1 to a6 and the main current output terminals U, V an W of the IGBT chips a1 to a6 in FIG. 1.

The control semiconductor chips 9 constitute the control circuit 10b. The control semiconductor chips 9 correspond to the control IC chips c1 to c4 in FIG. 1. In other words, the control circuit substrate 7 of the control circuit 10b is constituted by the bottom surface portion 12-1 of the case 12. At least one of the plurality of control semiconductor chips 9 is mounted on the control circuit wiring pattern 8b in a state where the rear surface is electrically conducted. In concrete terms, in the case of mounting the control semiconductor chip 9 on the control circuit wiring pattern 8b, the rear surface of the control semiconductor chip 9 is bonded with the control circuit wiring pattern 8b on the bottom surface portion 12-1 of the case 12 by a bonding material (not illustrated), such as silver (Ag) paste or bonding solder.

At least one of the plurality of control semiconductor chips 9 may be mounted on the bottom surface portion 12-1 (insulating member) of the case 12 outside the control circuit wiring pattern 8b (not illustrated). Further, at least one of the plurality of control semiconductor chips 9 may be mounted on the control circuit wiring pattern 8b in a state where the rear surface is electrically insulated (not illustrated). In concrete terms, in the case of mounting the control semiconductor chip 9 on the control circuit wiring pattern 8b, the rear surface of the control semiconductor chip 9 is bonded with the control circuit wiring pattern 8b by an insulating adhesive or insulating member. Thereby the rear surface of the control semiconductor chip 9 and the control circuit wiring pattern 8b are electrically insulated.

An example of the control semiconductor chip 9 which maintains an electrically conducted state with the control circuit wiring pattern 8b on the rear surface, is a BSD (Boot Strap Diode) chip, where a vertical device is formed. FIG. 1 is an example when all the control semiconductor chips 9 (control IC chips c1 to c4) are mounted on the control circuit wiring pattern 8b in a state where the rear surfaces are electrically conductible. An example of the control semiconductor chip 9, which is mounted on the control circuit wiring pattern 8b in a state where the rear surface is electrically insulated or mounted on the insulating member, is a semiconductor chip where a horizontal device is formed.

It is preferable that the surface of the control circuit substrate 7, on which the control circuit wiring pattern 8b is formed, is located at a higher position than the principal surface of the main circuit substrate 1 on which the main circuit wiring pattern 4 is formed, in a direction perpendicular to the principal surface of the main circuit substrate 1. Further, it is preferable that the surface of the control circuit substrate 7 on which the main circuit wiring pattern 4 is formed forms a step from the principal surface of the main circuit substrate 1 on which the main circuit wiring pattern 4 is formed. Hereafter the surface of the control circuit substrate 7, on which the control circuit wiring pattern 8b is formed (surface that is parallel with the pincipal surface of the main circuit substrate 1), is regarded as the principal surface of the control circuit substrate 7. In other words, it is preferable that the principal surface of the control circuit substrate 7 protrudes more inward in the case 12 than the principal surface of the main circuit substrate 1.

For example, the step may be formed between the principal surface of the control circuit substrate 7 and the principal surface of the main circuit substrate 1 by making the thickness of the control circuit substrate 7 (thickness in a direction perpendicular to the principal surface of the main circuit substrate 1 of the bottom surface portion 12-1) thicker than the thickness of the main circuit substrate 1. The control circuit substrate 7 and the main circuit substrate 1 may be disposed so that a step is formed between the principal surface of the control circuit substrate 7 and the principal surface of the main circuit substrate 1. Because of this step, the control semiconductor chips 9 on the control circuit substrate 7 are disposed at a position distant from the semiconductor chips 5 and 6 on the main circuit substrate 1, in a direction perpendicular to the principal surface of the main circuit substrate 1. As a consequence, the propagation of noise, generated in the power semiconductor elements on the semiconductor chips 5 and 6 to the control semiconductor elements on the control semiconductor chips 9, can be suppressed.

The other ends of the front surface electrodes (not illustrated) of the control semiconductor chips 9 are electrically connected to the front surface electrodes of the semiconductor chips 5 and 6 and the control circuit wiring pattern 8b through bonding wires having a narrow diameter. The lead terminals for control 13b correspond to the control signal input terminals VB(U), VB(V) and VB(W) of the control IC chips c1, c2 and c3 and the control signal input terminals IN(LU), IN(LV) and IN(LW) of the control IC chip c4 in FIG. 1. The area between the case 12 and the main circuit substrate 1 is filled with sealing resin 14.

Figure 3:
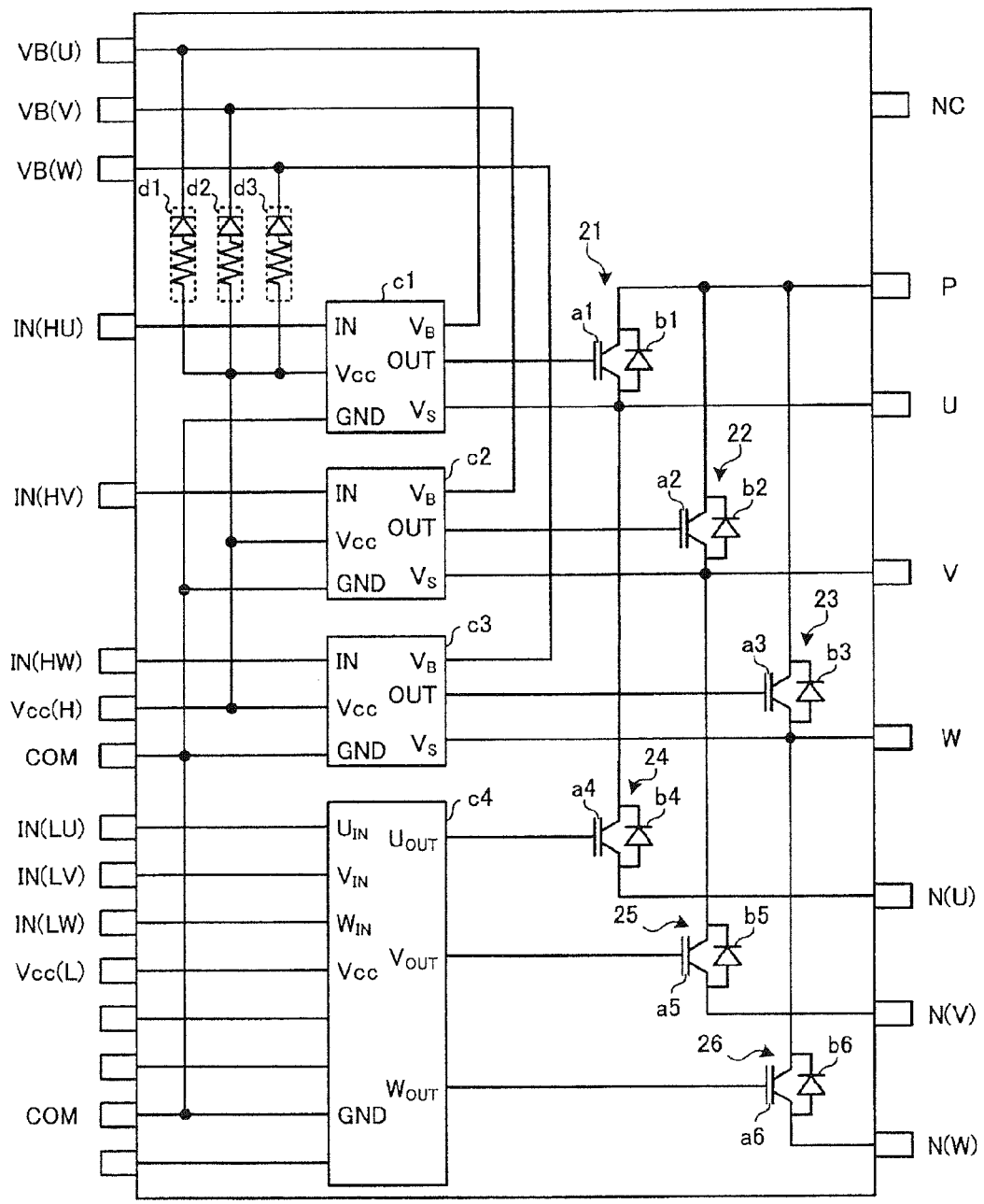
FIG. 3 is a circuit diagram illustrating a configuration of a three-phase inverter disposed in the module type power semiconductor device in FIG. 1.
Figure 4:
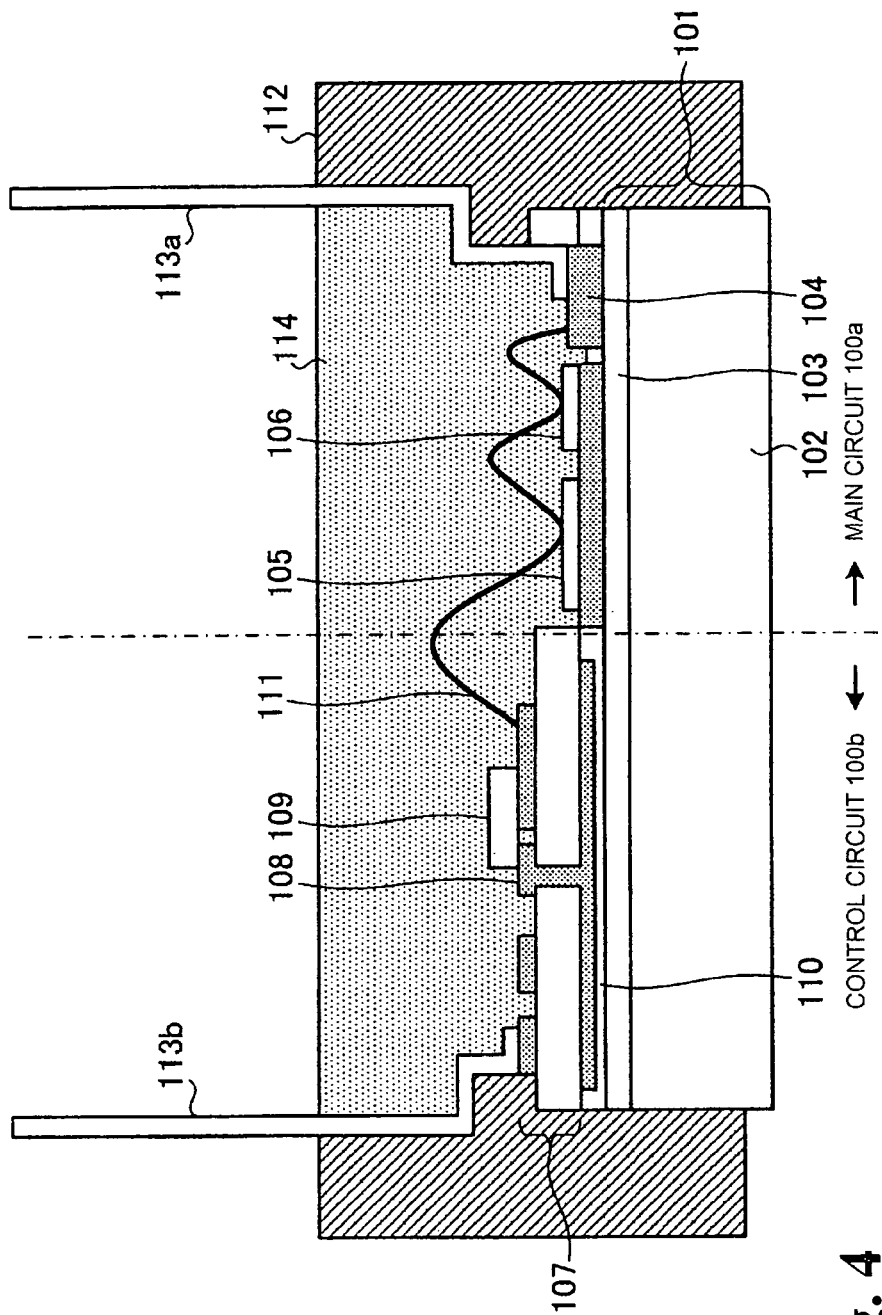
FIG. 4 is a cross-sectional view illustrating a cross-sectional structure of a conventional module type power semiconductor device.

Now the configuration of an inverter circuit disposed on the module type power semiconductor device in FIG. 1 will be described in detail. FIG. 3 is a circuit diagram illustrating a configuration of a three-phase inverter disposed in the module type power semiconductor device in FIG. 1. As shown in FIG. 3, in a general three-phase inverter circuit, the upper arm portions 21, 22 and 23 and the lower arm portions 24, 25 and 26 are connected in series in each of the U, V and W phases, and the serially connected bodies of the upper and the lower arm portions are connected in parallel. Each arm portion is constituted by an IGBT and an FWD, which are connected in parallel in reverse directions respectively.

The collectors of the IGBTs a1, a2 and a3 of the upper arm portions 21, 22 and 23 are connected to a main current input terminal P. The emitters of the IGBTs a4, a5 and a6 of the lower arm portions 24, 25 and 26 are connected to the main current input terminals N(U), N(V) and N(W) respectively. The main current output terminals U, V and W are connected between the emitters of the IGBTs a1, a2 and a3 of the upper arm portions 21, 22 and 23, and the collectors of the IGBTs a4, a5 and a6 of the lower arm portions 24, 25 and 26 respectively. The main current output terminals U, V and W are connected to the $V_s$ terminals of the control IC chips c1, c2 and c3 respectively, so that the reference potentials of the IGBTs a1, a2 and a3 of the upper arm portions 21, 22 and 23 become emitter potentials. NC is a normally closed contact terminal.

The control IC chips c1, c2 and c3 are high side gate drivers which drive the IGBTs a1, a2 and a3 of the upper arm portions 21, 22 and 23. The IN terminals of the control IC chips c1, c2 and c3 are connected to the control signal input terminals IN(HU), IN(HV) and IN(HW) respectively, and receive control signals inputted from outside. The OUT terminals of the control IC chips c1, c2 and c3 are connected to the gates of the IGBTs a1, a2 and a3 of the upper arm portions 21, 22 and 23 respectively.

The OUT terminals of the control IC chips c1, c2 and c3 output the output signals corresponding to the control signals inputted to the IN terminals as the gate signals of the IGBTs a1, a2 and a3 respectively. The $V_B$ terminals of the control IC chips c1 to c3 are connected to the high side power supply terminals for starting the control IC chips c1 to c3 respectively. In concrete terms, the $V_B$ terminals of the control IC chips c1, c2 and c3 are directly connected to the control signal input terminals VB(U), VB(V) and VB(W) respectively.

The Vcc terminals of the control IC chips c1 to c3 are connected to the low side power supply terminals for starting the control IC chips c1 to c3 respectively. In concrete terms, the Vcc terminals of the control IC chips c1 to c3 are connected to a Vcc(H) terminal. The GND terminals of the control IC chips c1 to c3 are connected to a COM terminal, which is a common potential point of which potential is lower than that of the Vcc(H) terminal. The BSDs d1, d2 and d3 are connected between the $V_B$ terminals and the Vcc terminals of the control IC chips c1, c2 and c3 respectively. Each of the BSDs d1, d2 and d3 is constituted by a diode and a resistor, which are connected in series.

The cathodes of the diodes constituting the BSDs d1, d2 and d3 are connected to the $V_B$ terminals of the control IC chips c1, c2 and c3 respectively. The anodes of the diodes constituting the BSDs d1, d2 and d3 are connected to the Vcc terminals of the control IC chips c1, c2 and c3 through resistors respectively. The BSDs d1, d2 and d3 have a function to charge the capacitors embedded in the control IC chips c1, c2 and c3 respectively, so as to prevent discharge. The resistors of the BSDs d1, d2 and d3 have a function to suppress the sudden flow of current from the Vcc terminal on the low side to the $V_B$ terminal on the high side.

The control IC chip c4 is a low side gate driver, which drives the IGBTs a4, a5 and a6 of the lower arm portions 24, 25 and 26. A $U_{IN}$ terminal, a $V_{IN}$ terminal and a $W_{IN}$ terminal of the control IC chip c4 are connected to the control signal input terminals IN(LU), IN(LV) and IN(LW) respectively. A $U_{OUT}$ terminal, a $V_{OUT}$ terminal and a $W_{OUT}$ terminal of the control IC chip c4 are connected to the gates of the IGBTs a4, a5 and a6 of the lower arm portions 24, 25 and 26 respectively.

The $U_{OUT}$ terminal, $V_{OUT}$ terminal and $W_{OUT}$ terminal of the control IC chip c4 output the output signals corresponding to the control signals inputted to the $U_{IN}$ terminal, $V_{IN}$ terminal and $W_{IN}$ terminal as the gate signals of the IGBTs a4, a5 and a6 respectively. The Vcc terminal of the control IC chip c4 is connected to a power supply terminal Vcc(L) for starting the control IC chip c4. The GND terminal of the control IC chip c4 is connected to the COM terminal, that is a common potential point of which potential is lower than that of the power supply terminal Vcc(L). The other terminals of the control IC chip c4 are general purpose input/output terminals.

The operation of this inverter will be described using the U phase as an example. The computer IC chip c4 is driven by the potential difference between the Vcc terminal and the GND terminal of the control IC chip c4. The control IC chip c4 outputs an ON signal, received from the IN(LU) terminal, as a gate signal of the IGBT a4 of the lower arm portion 24. The IGBT a4 of the lower arm portion 24 becomes the ON state when the gate signal is inputted.

When the potential between the $V_B$ terminal and the $V_S$ terminal of the control IC chip is low, in other words, when the IGBT a4 of the lower arm portion 24 is in the ON state, current flows from the Vcc terminal to the $V_B$ terminal of the control IC chip c1, and a capacitor (not illustrated), which is disposed outside the inverter circuit, is charged. Then when the potential between the $V_B$ terminal and the $V_S$ terminal of the control IC chip c1 becomes a predetermined high potential, the flow of the current to charge the capacitor is stopped. The potential difference between the $V_B$ terminal–$V_S$ terminal voltage and the Vcc terminal–GND terminal voltage of the control IC chip c1 is the drive voltage of the control IC chip c1.

The control IC chip c1 receives an input of an ON signal from the IN(HU) terminal, and outputs an output signal, having a same potential as the $V_B$ terminal, as a gate signal of the IGBT a1 of the upper arm portion 21. The IGBT a1 of the upper arm portion 21 receives the input of the gate signal from the control IC chip c1, and enters the ON state. On the other hand, the control IC chip c1 receives an input of an OFF signal from the IN(HU) terminal, and outputs an output signal, having a same potential as the $V_S$ terminal, as a gate signal of the IGBT a1 of the upper arm portion 21. The IGBT a1 of the upper arm portion 21 receives the input of the gate signal from the control IC chip c1, and enters the OFF state.

In the V phase and W phase as well, operation is the same as the case of the U phase. In other words, the control IC chip c4 outputs an ON signal from the IN(LV) terminal as a gate signal of the IGBT a5 of the lower arm portion 25, and sets the IGBT a5 of the lower arm portion 25 to the ON state. Thereby the control IC chip c2 is started. The control IC chip c2 receives an ON/OFF signal from the IN(HV) terminal, outputs a gate signal of the IGBT a2 of the upper arm portion 22, and sets the IGBT a2 of the upper arm portion 22 to the ON or OFF state.

In the W phase, the control IC chip c4 outputs an ON signal from the IN(LW) terminal as a gate signal of the IGBT a6 of the lower arm portion 26, and sets the IGBT a6 of the lower arm portion 26 to the ON state. Thereby the control IC chip c3 is started. The control IC chip c3 receives an ON/OFF signal from the IN(HW) terminal, outputs a gate signal of the IGBT a3 of the upper arm portion 23, and sets the IGBT a3 of the upper arm portion 23 to the ON or OFF state.

As described above, according to this embodiment, the main circuit is constructed by forming the main circuit wiring pattern, with which the IGBT chips or the like (semiconductor chips on which power semiconductor elements are formed) are bonded, on the main circuit substrate. Further, according to this embodiment, the control circuit is constructed by forming the control circuit wiring pattern, on which the control IC chips are mounted, on the bottom surface portion of the case, whereby the main circuit and the control circuit can be separated. Therefore the propagation of noise, generated in the power semiconductor elements to the control semiconductor elements, can be suppressed.

According to this embodiment, the control circuit substrate and the main circuit substrate are disposed, or the thickness of the control circuit substrate is increased, so that a step is formed between the principal surface of the control circuit substrate and the principal surface of the main circuit substrate. Thereby the control IC chips on the control circuit substrate are disposed distant from the semiconductor chips on the main circuit substrate in a direction perpendicular to the principal surface of the main circuit substrate. Therefore the propagation of noise, generated in the power semiconductor elements, can be further suppressed.

According to this embodiment, the control circuit wiring pattern is formed by a metal foil or a lead frame, hence it is unnecessary to dispose the control circuit substrate as the control circuit wiring pattern, and solder printing for the control circuit wiring pattern is likewise unnecessary. In other words, the power semiconductor chips and the control semiconductor chips can be more easily mounted compared with the case of disposing the main circuit wiring pattern and the control circuit wiring pattern on the main circuit substrate, on which the control circuit substrate is disposed, and performing solder printing for [the main circuit wiring pattern and the control circuit wiring pattern].

According to this embodiment, the control circuit wiring pattern is one member that is integrated with the external connection terminals (lead terminals), and the lead terminals are formed as one member that is integrally molded with the case, therefore man-hours for assembling can be decreased. Thereby a module type semiconductor device which excels in productivity can be manufactured. As a consequence, a semiconductor device having a structure which can be manufactured with few processing steps at low cost can be provided.

According to this embodiment, external connection terminals are constructed by lead terminals, which are integrally molded so as to extend from the case, whereby it is unnecessary to bend the lead terminals at different predetermined pitches depending on the lead terminal row, so as to match with the concave/convex portions of the inner walls of the case. Therefore the number of times of bending the lead terminals can be decreased, and the bending accuracy of the lead terminals can be improved. Furthermore, handling of the lead terminals during assembly becomes easy. As a consequence, a semiconductor device having a structure which can be manufactured with few processing steps at low can be provided.

According to this embodiment, the rear surfaces of the control semiconductor chips are bonded with the bottom surface portion of the case, so as to maintain the electrically conducted state or insulated state with the control circuit wiring pattern, whereby the plurality of control semiconductor chips, on which different control semiconductor elements are formed, can be flexibly mounted inside the case. This means that various control semiconductor chips can be mounted on the same insulating member with few assembly man-hours without changing the case, and versatility of the case can be enhanced. As a consequence, the cost of the semiconductor device can be reduced.

In the present invention described above, the inverter was used as an example, but the present invention is not limited to this embodiment, but can be applied to semiconductor devices having various configurations, such as a semiconductor device where a main circuit substrate that requires a special configuration to radiate heat and other circuit substrates that do not require a special configuration to radiate heat are mounted in a same package. Further, in this invention, an example of forming the control circuit wiring pattern on the bottom surface portion of the case was described, but the control circuit wiring pattern may be formed on an insulating member other than the case, only if the insulating member has a surface which is parallel with the principal surface of the main circuit substrate.

INDUSTRIAL APPLICABILITY

As described above, the semiconductor device according to this invention is useful for a power semiconductor device which is used for a power converting device, such as an inverter.

EXPLANATION OF REFERENCE NUMERALS 1 main circuit substrate
2 metal plate
3 insulating layer
4 main circuit wiring pattern
5, 6 semiconductor chip
7 control circuit substrate
8a conductor pattern
8b control circuit wiring pattern
9 control semiconductor chip
10a main circuit
10b control circuit
12 case
12-1 bottom surface portion of case
12-2 side wall portion of case
13a lead terminals used for power
13b lead terminals used for control

What is claimed is:
1. A semiconductor device, comprising:
a plurality of semiconductor elements;
first semiconductor chips including first semiconductor elements, the first semiconductor elements being defined as semiconductor elements in the plurality of semiconductor elements and having a current flowing greater than those of the other semiconductor elements;
second semiconductor chips having second semiconductor elements, the second semiconductor elements being defined as semiconductor elements in the plurality of semiconductor elements for controlling the first semiconductor elements;
a case including a bottom surface portion having an opening;
an insulating substrate having a first wiring pattern and the first semiconductor chips bonded with the first wiring pattern, and disposed in the opening;
an insulating member disposed on the bottom surface portion and having a second wiring pattern mounted with the second semiconductor chips; and
external connection lead terminals mounted on an upper surface of the bottom surface portion,
wherein a surface of the insulating member having the second wiring pattern is located at a higher position than a principal surface of the insulating substrate having the first wiring pattern in a direction perpendicular to the principal surface of the insulating substrate, so as to form a step from the principal surface of the insulating substrate having the first wiring pattern,
the second wiring pattern and the first wiring pattern are separated by the step in the direction perpendicular to the principal surface of the insulating substrate, the external connection lead terminals and the second semiconductor chips are disposed on the bottom surface portion at the position higher than that of the insulating substrate having the first wiring pattern, the insulating substrate is bonded to the insulating member, the case further comprises a side wall portion extending perpendicularly upwardly from a periphery of the upper surface of the bottom surface portion, the bottom surface portion further comprises:

one bottom surface portion arranged on one side of the bottom surface portion having the insulating member and the second semiconductor chips, and another bottom surface portion arranged on another side of the bottom surface portion, and the external connection lead terminals are mounted on said one and another bottom surface portions and extend horizontally along the upper surface of the bottom surface portion from an edge of the opening to outside of the case through the side wall portion.

2. The semiconductor device according to claim 1, wherein the second wiring pattern is integrated with the external connection lead terminals of the second semiconductor elements.

3. The semiconductor device according to claim 1, wherein the second wiring pattern is formed from a metal foil or a lead frame.

4. The semiconductor device according to claim 1, wherein the case is integrally molded with the external connection lead terminals of the second semiconductor elements and the second wiring pattern.

5. The semiconductor device according to claim 1, wherein the second wiring pattern is formed on an inner wall of the case.

6. The semiconductor device according to claim 1, wherein at least one of the plurality of second semiconductor elements is mounted on the second wiring pattern in a state in which a rear surface thereof is electrically conductive.

7. The semiconductor device according to claim 1, wherein at least one of the plurality of second semiconductor elements is mounted on the insulating member outside the second wiring pattern.

8. The semiconductor device according to claim 1, wherein at least one of the plurality of second semiconductor elements is mounted on the second wiring pattern in a state in which a rear surface thereof is electrically insulated.

9. The semiconductor device according to claim 1, wherein the opening extends vertically downwardly from the upper surface of the bottom surface portion, and is widened laterally and outwardly, and the first semiconductor chips are disposed on the insulating substrate and is located inside the opening so that the first semiconductor chips do not protrude beyond the upper surface of the bottom surface portion.

* * * * *